(12) United States Patent
Cheng et al.

(10) Patent No.: US 9,123,839 B2
(45) Date of Patent: Sep. 1, 2015

(54) IMAGE SENSOR WITH STACKED GRID STRUCTURE

(71) Applicant: Taiwan Semiconductor Manufacturing Company Limited, Hsin-Chin (TW)

(72) Inventors: Yun-Wei Cheng, Taipei (TW); Volume Chien, Sinying (TW); Chao Chih-Kang, Tainan (TW); Chi-Cherng Jeng, Madou Township (TW); Chen Hsin-Chi, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 135 days.

(21) Appl. No.: 13/799,043

(22) Filed: Mar. 13, 2013

(65) Prior Publication Data

US 2014/0264685 A1    Sep. 18, 2014

(51) Int. Cl.
*H01L 27/146* (2006.01)
*H01L 31/0232* (2014.01)
*H01L 31/18* (2006.01)
*H01L 27/144* (2006.01)

(52) U.S. Cl.
CPC ...... *H01L 31/02327* (2013.01); *H01L 27/1463* (2013.01); *H01L 27/1464* (2013.01); *H01L 27/14629* (2013.01); *H01L 27/14683* (2013.01); *H01L 31/18* (2013.01); *H01L 27/1446* (2013.01)

(58) Field of Classification Search
CPC .................................................. H01L 27/1463
USPC ..................... 257/432, 447, E27.133; 438/73
See application file for complete search history.

(56) References Cited

U.S. PATENT DOCUMENTS

| | | | |
|---|---|---|---|
| 6,071,826 A | 6/2000 | Cho et al. | |
| 6,350,127 B1 | 2/2002 | Chiang et al. | |
| 6,627,475 B1 | 9/2003 | Yang et al. | |
| 6,815,787 B1 | 11/2004 | Yaung et al. | |
| 2009/0194835 A1* | 8/2009 | Park | 257/459 |
| 2010/0244173 A1* | 9/2010 | Wang et al. | 257/435 |
| 2013/0241018 A1* | 9/2013 | JangJian et al. | 257/432 |
| 2014/0339615 A1* | 11/2014 | Wang et al. | 257/294 |
| 2015/0014802 A1* | 1/2015 | Cheng et al. | 257/432 |
| 2015/0048467 A1* | 2/2015 | Weng et al. | 257/432 |

* cited by examiner

*Primary Examiner* — Su C Kim
*Assistant Examiner* — Regan J Rundio
(74) *Attorney, Agent, or Firm* — Cooper Legal Group, LLC (57) ABSTRACT

Among other things, one or more image sensors and techniques for guiding light towards a photodiode are provided. An image sensor comprises a metal grid configured to direct light towards a corresponding photodiode and away from other photodiodes. The image sensor also comprises a dielectric grid and a filler grid over the metal grid to direct light towards the corresponding photodiode and away from other photodiodes, where the filler grid has a different refractive index than the dielectric grid. In this way, crosstalk, otherwise resulting from detection of light by incorrect photodiodes, is mitigated.

20 Claims, 14 Drawing Sheets

IMAGE SENSOR WITH STACKED GRID STRUCTURE

BACKGROUND

An image sensor is used to convert an optical image focused on the image sensor into an electrical signal. The image sensor comprises an array of light detecting elements, such as photodiodes, where a light detecting element is configured to produce an electrical signal corresponding to an intensity of light impinging on the light detecting element. The electrical signal is used to display a corresponding image on a monitor or provide information about the optical image. In some embodiments, the image sensor is a charge-coupled device (CCD), a Complementary Metal-Oxide-Semiconductor (CMOS) image sensor device, or other type of sensor.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more image sensors and one or more techniques for forming such image sensors are provided herein. In an example, an image sensor comprises a photodiode array formed over a substrate. The photodiode array comprises one or more photodiodes, such as image sensor pixels, configured to accumulate energy generated by light, such as from photons, of an optical image. A voltage of a photodiode can be read as an output for the optical image. In some embodiments, a photodiode is situated under one or more layers or components formed over the substrate. Because light passes through the layers or components before reaching the photodiode, the light can travel towards another photodiode that is not to detect the light. Thus, the light could be detected by the other photodiode, such as a neighboring or adjacent photodiode, which can result in crosstalk where incorrect or multiple photodiodes detect light that is otherwise to be detected by a particular photodiode. Crosstalk can degrade performance of the image sensor, increase noise, and decrease signals produced by the image sensor. In some embodiments, crosstalk can become problematic for photodiodes having dimensions of 1.2 µm or below. Accordingly, a stacked grid structure for crosstalk reduction is provided herein. The stacked grid structure comprises a metal grid configured to reflect light towards corresponding photodiodes. In some embodiments, the metal grid is not limited to a metal material, but can be formed out of any material having a relatively high reflective property. The stacked grid structure comprises a dielectric grid formed above the metal grid. In some embodiments, a filler grid is formed over the dielectric grid. The filler grid comprises a filler material having a refractive index that is greater than a refractive index of the dielectric grid. Respective dielectric grid portions are positioned above the metal grid portions. In this way, the metal grid and the dielectric grid guide light towards corresponding photodiodes. For example, the metal grid can guide light based upon a reflective property of the metal grid, and the dielectric grid can guide light based upon the difference in refractive index between the dielectric grid and the filler grid.

Figure 1:
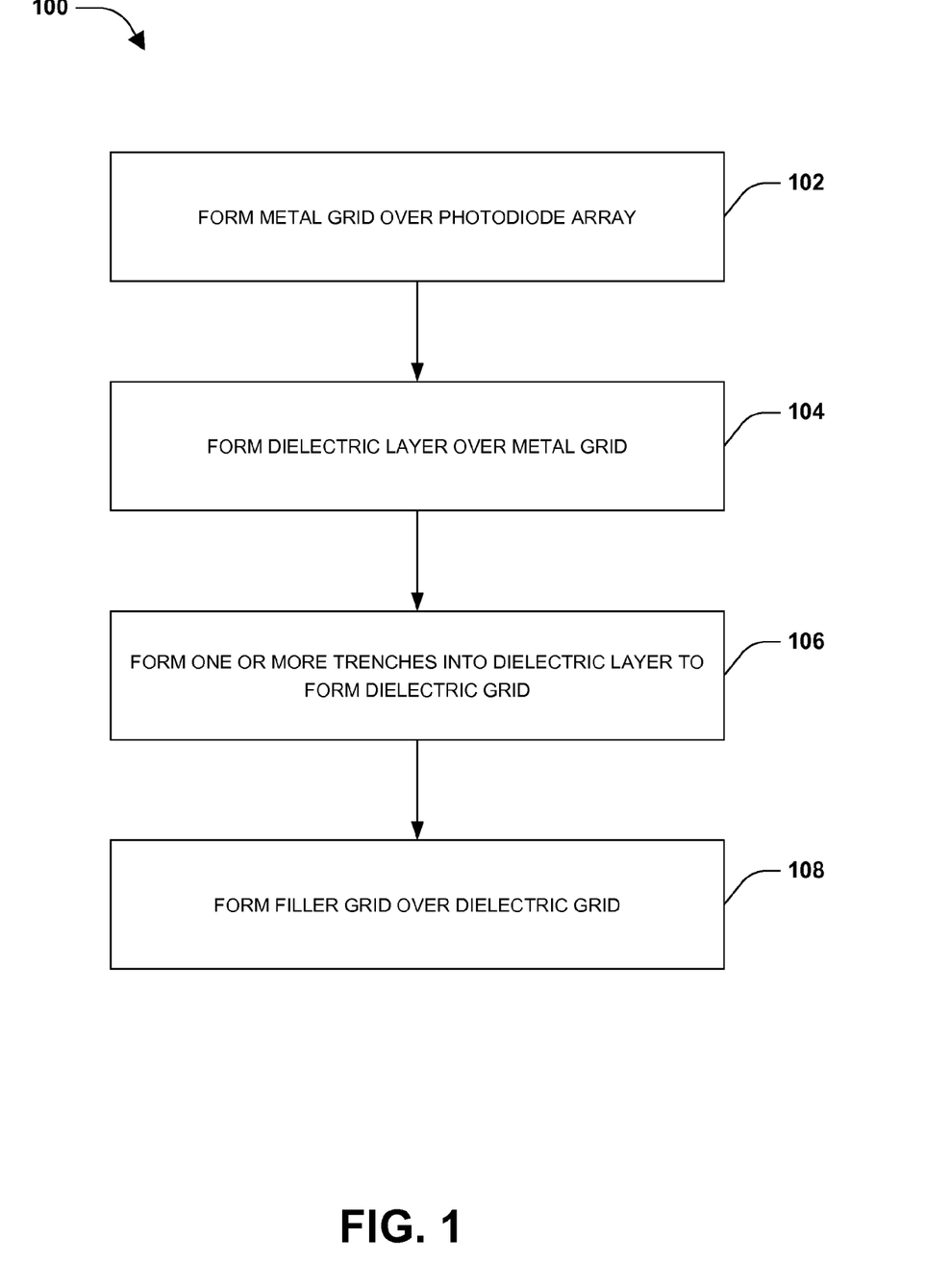
FIG. 1 is a flow diagram illustrating a method of forming an image sensor, according to some embodiments.
Figure 2:
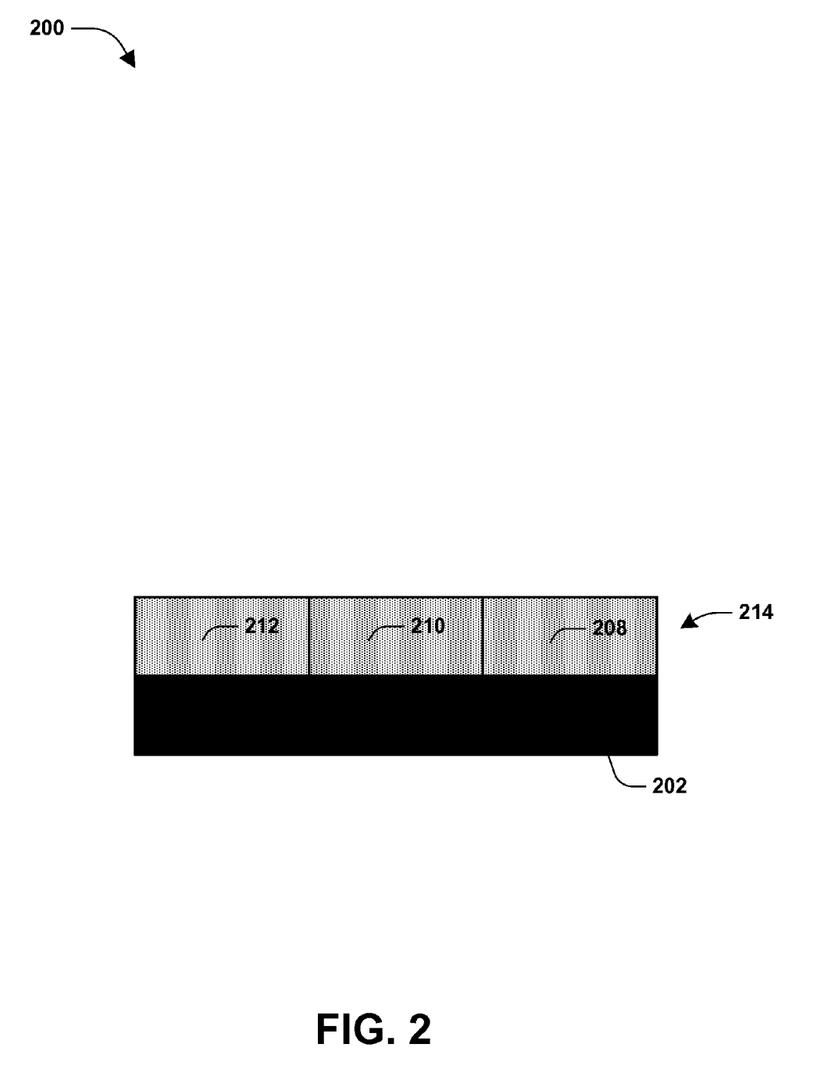
FIG. 2 is an illustration of a photodiode array of an image sensor, according to some embodiments.
Figure 3:
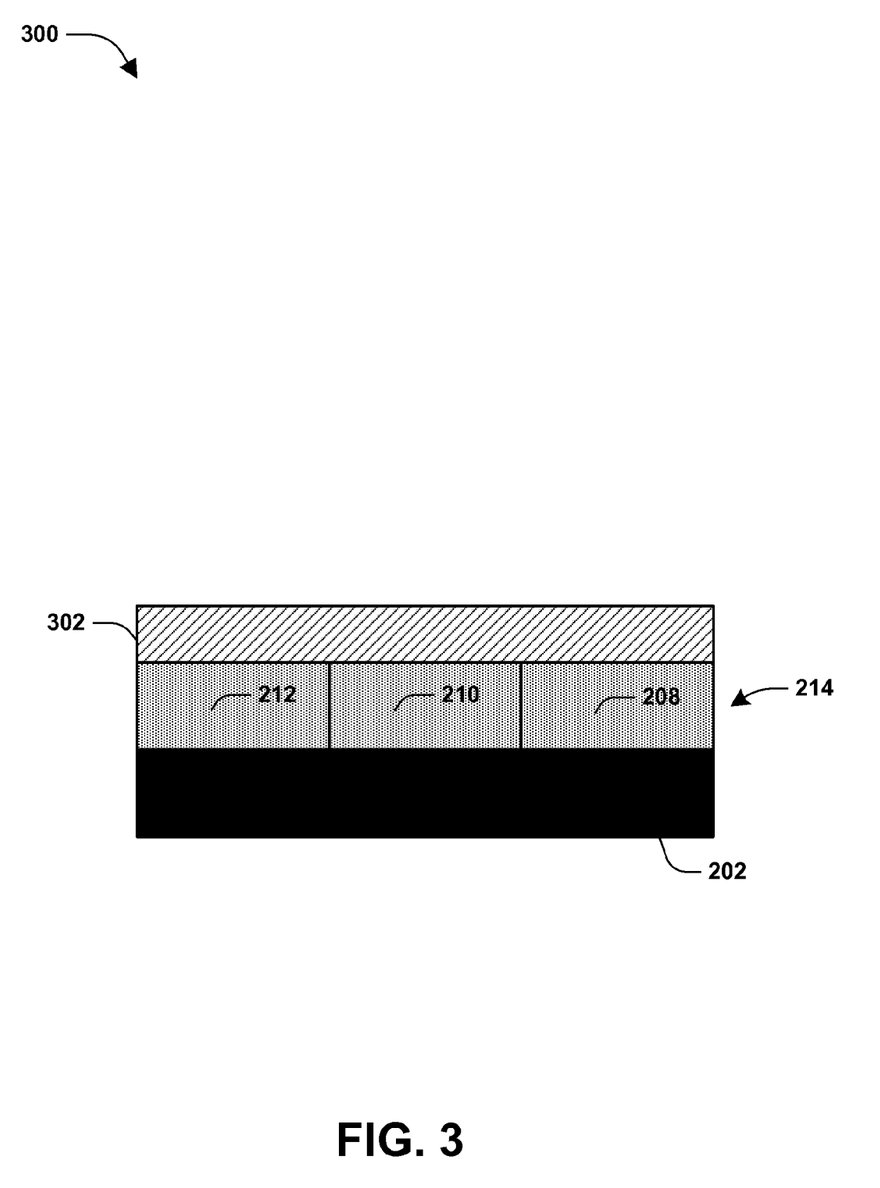
FIG. 3 is an illustration of an anti-reflective layer of an image sensor, according to some embodiments.

A method 100 of forming an image sensor, according to some embodiments, is illustrated in FIG. 1, and one or more image sensors formed by such a methodology are illustrated in FIGS. 2-12. A photodiode array 214 is formed over a substrate 202, such as a silicon substrate, as illustrated in example 200 of FIG. 2. The photodiode array 214 comprises one or more photodiodes, such as a first photodiode 212, a second photodiode 210, a third photodiode 208, or other photodiodes not illustrated. In some embodiments, an anti-reflective coating 302 is formed over the photodiode array 214, as illustrated in example 300 of FIG. 3. The anti-reflective coating 302 is used to inhibit light from being reflected away from the photodiode array 214 so that the light reaches the photodiode array 214. In some embodiments, the anti-reflection coating 302 comprises a high-k material, such as hafnium (IV) oxide (HfO2), tantalum pentoxide (Ta2O5), zirconium dioxide (ZrO2), aluminum oxide (Al2O3), or other high-k material. In some embodiments, the anti-reflection coating 302 is formed using a sputtering process, a furnace process, or other process. In an example, the anti-reflection coating 302 is between about 10 A and about 500 A in thickness.

Figure 4:
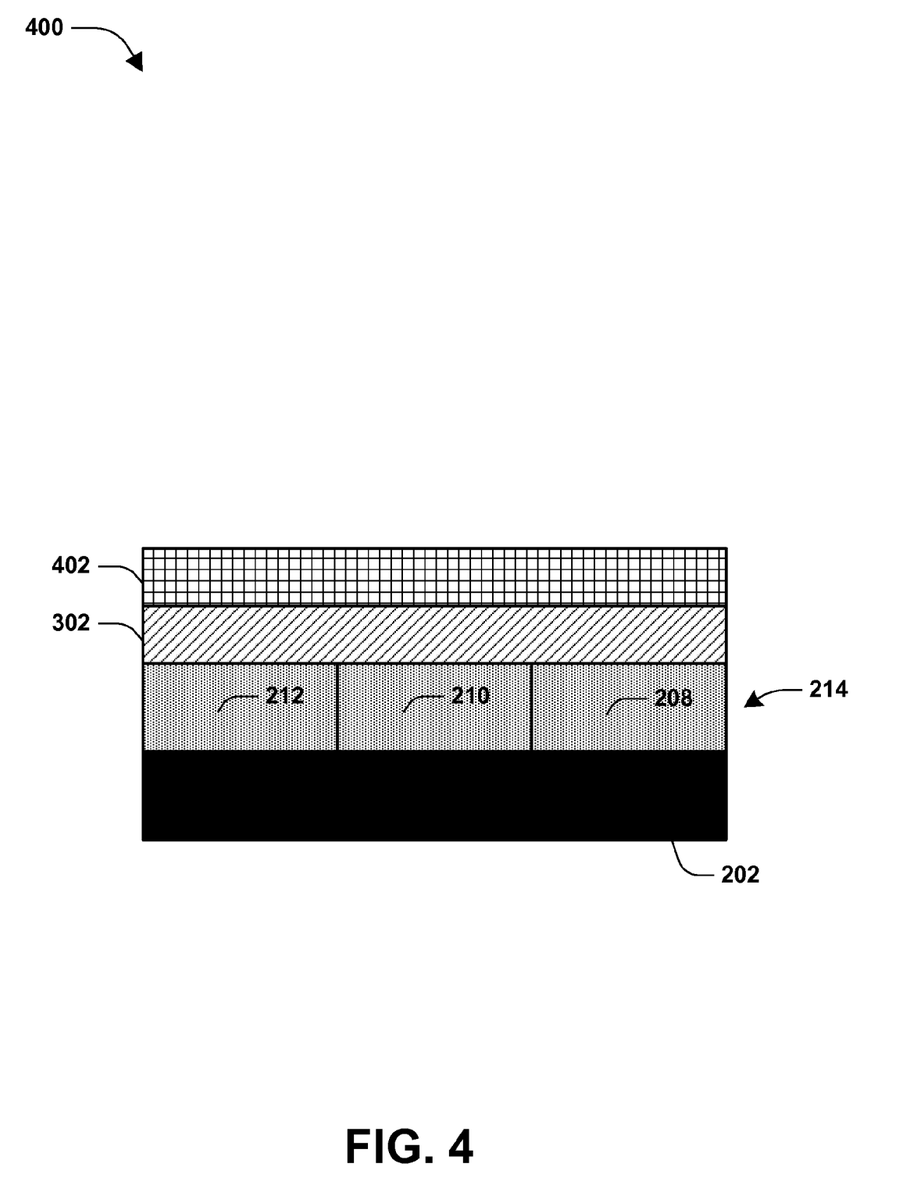
FIG. 4 is an illustration of a barrier layer of an image sensor, according to some embodiments.

In some embodiments, a buffer layer 402 is formed over the photodiode array 214, such as over the anti-reflection coating 302, as illustrated in example 400 of FIG. 4. In some embodiments, the buffer layer 402 is an adhesion layer for one or more layers formed over the buffer layer 402. For example, the buffer layer 402 improves adhesion between the anti-reflection coating 302 and a dielectric layer 602 formed over the buffer layer 402, as illustrated by example 600 of FIG. 6. In some embodiments, the buffer layer 402 comprises a dielectric material, such as silicon oxide (SiO), silicon nitride (SiN), silicon oxy-nitride (SiON), or other dielectric material. In some embodiments, the buffer layer 402 is formed using a chemical vapor deposition (CVD) or other technique. In an example, the buffer layer 402 is between about 500 A and about 2000 A in thickness.

Figure 5:
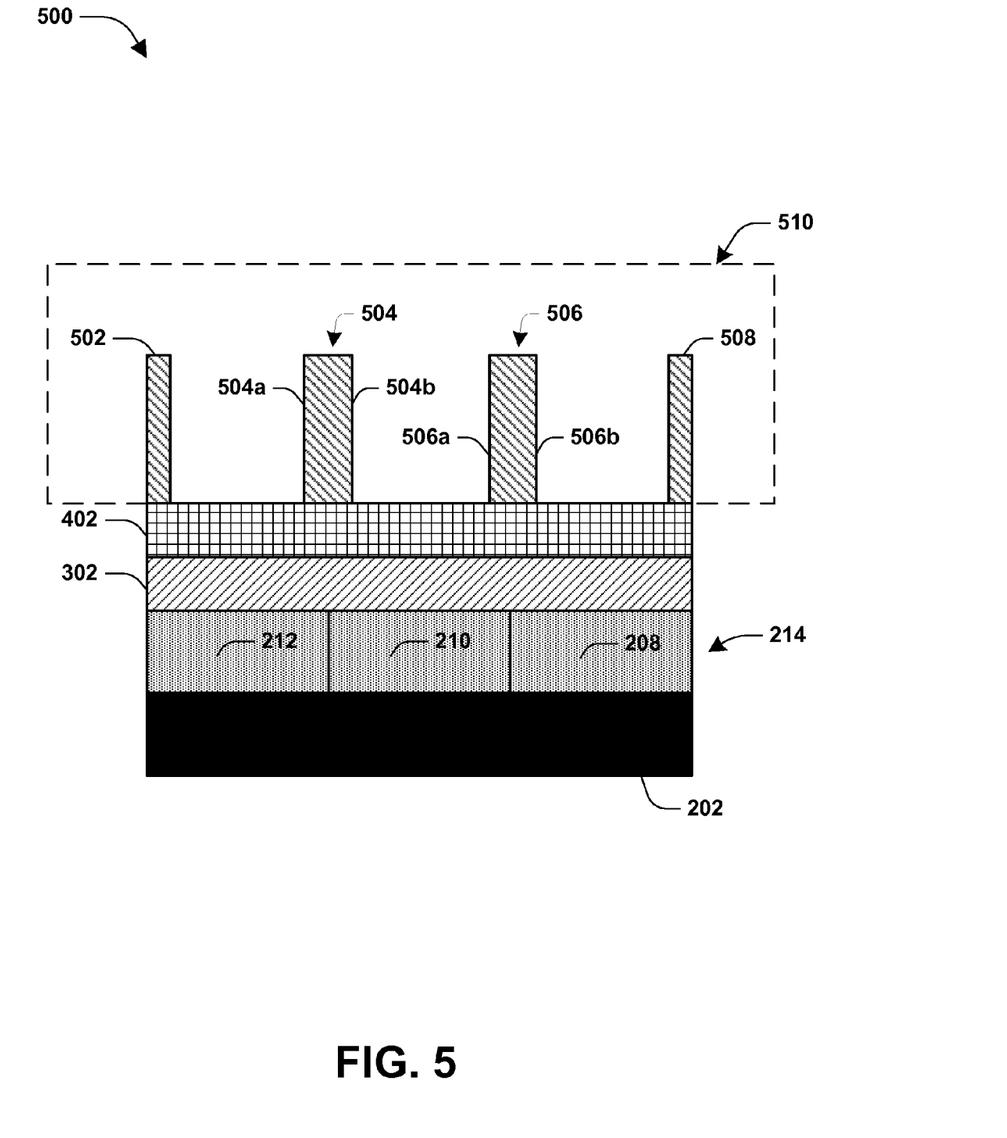
FIG. 5 is an illustration of a metal grid of an image sensor, according to some embodiments.

At 102, a metal layer, such as a metal grid 510, is formed over the photodiode array 214, such as over the buffer layer 402, as illustrated in example 500 of FIG. 5. In some embodiments, the metal grid 510 comprises titanium, tungsten, aluminum, copper, or other materials having a reflectance property capable of reflecting light. It is appreciated that the metal grid 510 is not limited to a metal material, but in some embodiments can comprise a material having a relatively high reflectance property so that the material can reflect light along a path substantially towards a corresponding photodiode as opposed to the material absorbing the light or allowing the light to pass through the material. In some embodiments, the metal grid 510 is formed using a sputtering process, a plating process, an evaporation process, or other deposition and/or etching process. For example, the metal grid is formed by initially depositing metal material and then selectively etching away portions of the metal material. In an example, the metal grid 510 is between about 100 A and about 3000 A in thickness.

In some embodiments, the metal grid 510 comprises one or more grid portions, such as a first metal grid portion 502, a second metal grid portion 504, a third metal grid portion 506, a fourth metal grid portion 508, or other grid metal portions not illustrated. In an example, the second metal grid portion 504 comprises a first interface 504a configured to guide light towards the first photodiode 212. For example, the first interface 504a reflects light as opposed to absorbing light or allowing light to pass through the first interface 504a to direct light towards the first photodiode 212. The second metal grid portion 504 comprises a second interface 504b configured to guide light towards a second photodiode 210. The third metal grid portion 506 comprises a third interface 506a configured to guide light towards the second photodiode 210. The third metal grid portion 506 comprises a fourth interface 506b configured to guide light towards the third photodiode 208. In this way, the metal grid 510 guides light, such as photons, towards corresponding photodiodes and deflects such light away from other photodiodes to mitigate crosstalk that can result in noise or performance degradation of the image sensor.

Figure 6:
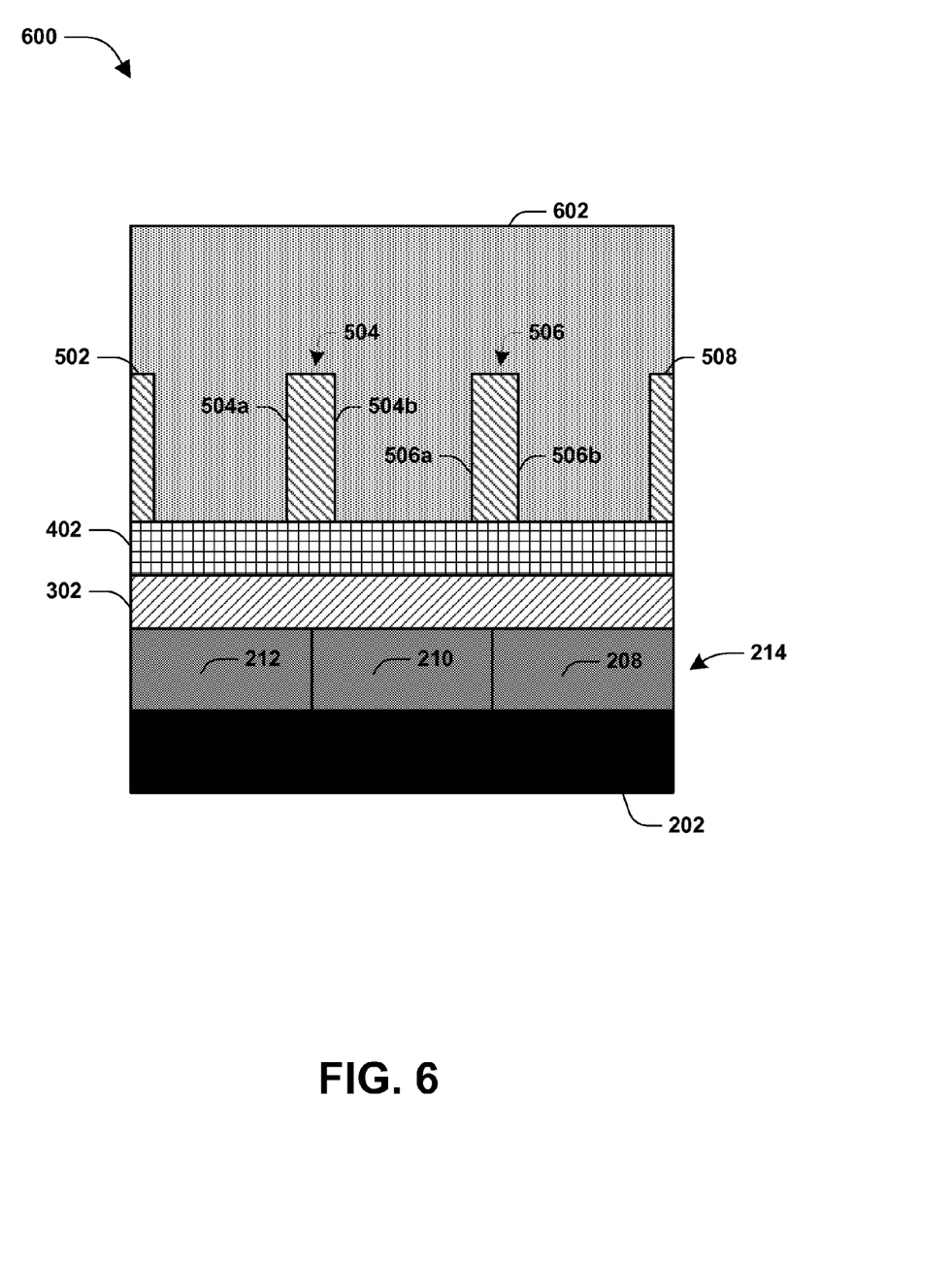
FIG. 6 is an illustration of a dielectric layer of an image sensor, according to some embodiments.

At 104, a dielectric layer 602 is formed over the metal grid 510, as illustrated in example 600 of FIG. 6. The dielectric layer 602 is formed to protect the photodiode array 212, other components, or layers formed beneath the dielectric layer 602. The dielectric layer 602 allows light to pass through so that the light can reach the photodiode array 214. In some embodiments, the dielectric layer 602 comprises a dielectric material, such as SiO, SiN, SiON, or other dielectric material. In some embodiments, the dielectric layer 602 is formed using chemical vapor deposition or other techniques, such as atomic layer deposition (ALD). In an example, the dielectric layer 602 is between about 1000 A and about 3000 A in thickness.

Figure 7:
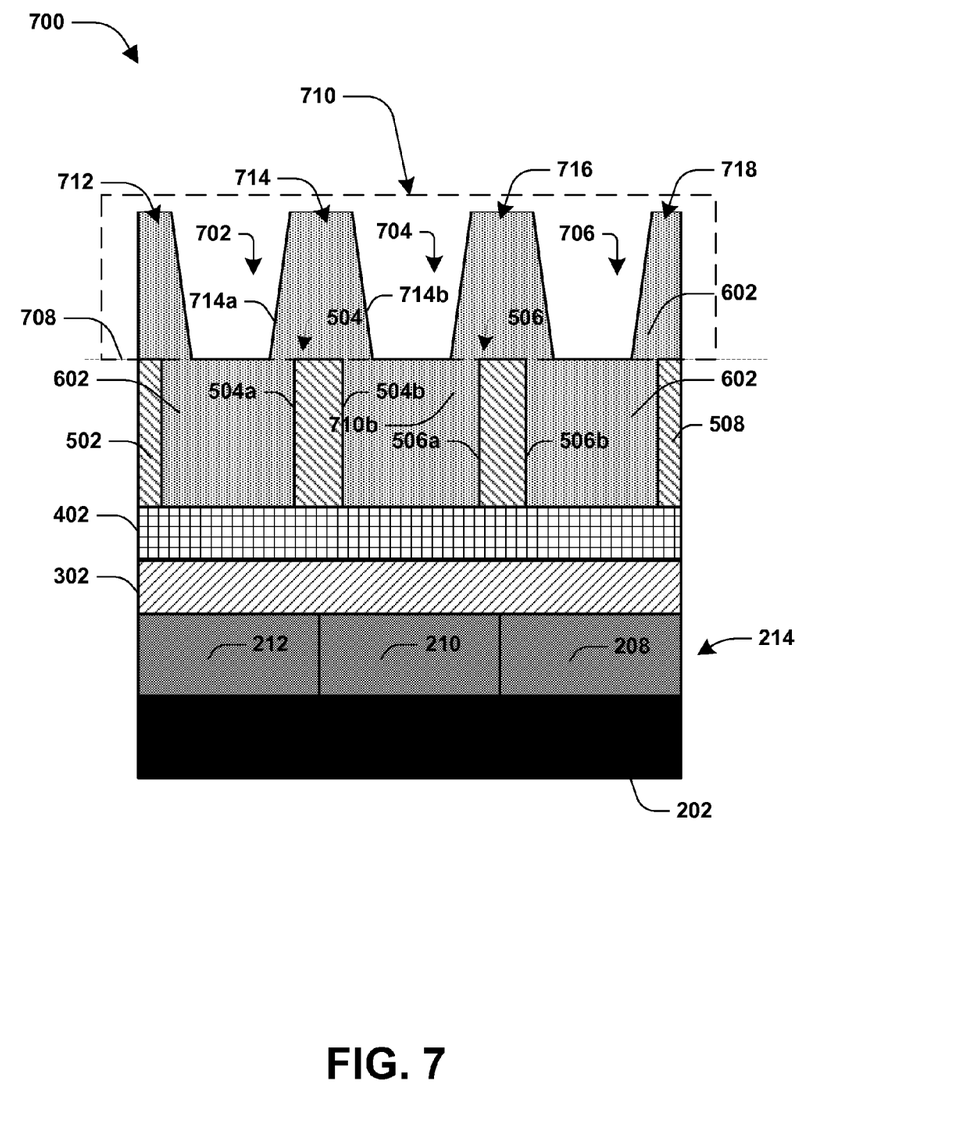
FIG. 7 is an illustration of one or more trenches formed within a dielectric layer of an image sensor to form a dielectric grid, according to some embodiments.

At 106, one or more trenches are formed into the dielectric layer 602 to form a dielectric grid 710, as illustrated in example 700 of FIG. 7. In some embodiments, a first trench 702 is formed within the dielectric layer 602 substantially over the first photodiode 212, a second trench 704 is formed within the dielectric layer 602 substantially over the second photodiode 210, a third trench 706 is formed within the dielectric layer 602 substantially over the third photodiode 208. In some embodiments, the one or more trenches are formed to a depth approximately to the top portion of the metal grid structure 510, as illustrated by dashed line 708. It will be appreciated, however, that the trenches can be formed to any suitable depth. In an example, the one or more trenches are formed using an etching process, a photolithography process, or other process that can remove portions of the dielectric layer 602.

In some embodiments, the dielectric grid 710 corresponds to a portion of the dielectric layer 602, after the one or more trenches are formed, overlaying the metal grid 510. For example, the dielectric grid 710 comprises a first dielectric grid portion 712 configured to guide light towards the first photodiode 212. The dielectric grid 710 comprises a second dielectric grid portion 714. The second dielectric grid portion 714 comprises a first surface 714a configured to guide light towards the first photodiode 212 and away from the second photodiode 210. The second dielectric grid portion 714 comprises a second surface 714b configured to guide light towards the second photodiode 210 and away from the first photodiode 212. The dielectric grid 710 comprises one or more additional dielectric grid portions, such as a third dielectric grid portion 716 and a fourth dielectric grid portion 718.

Figure 8A:
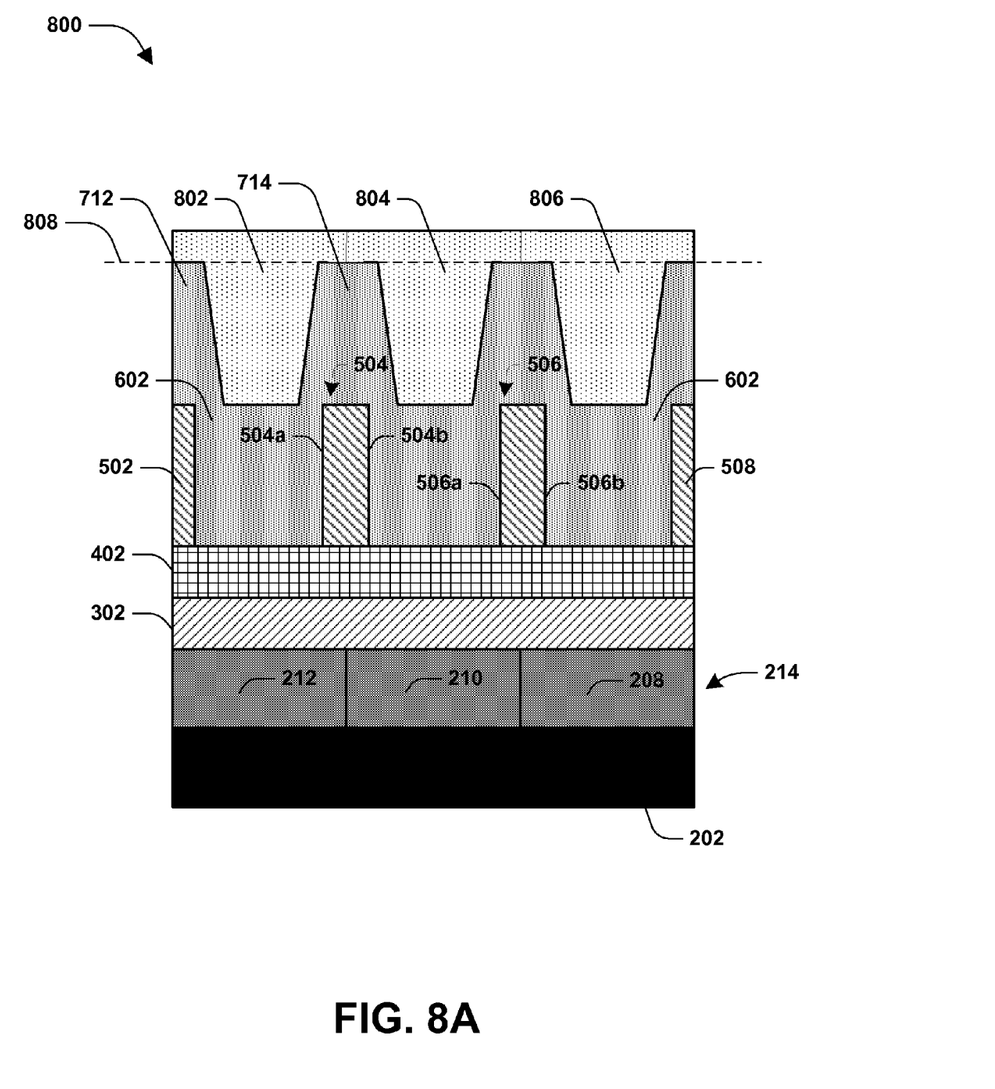
FIG. 8A is an illustration of a filler grid of an image sensor, according to some embodiments.

At 108, a filler grid is formed over the dielectric grid 710, such as within the one or more trenches, as illustrated by example 800 of FIG. 8A. The filler grid comprises a first filler grid portion 802, a second filler grid portion 804, a third filler grid portion 806, or other filler grid portions not illustrated. The filler grid is formed of a material having a different refractive index than a refractive index of the dielectric grid such that the filler grid, in conjunction with the dielectric grid, guides light to photodiodes in a desired manner. For example, the first filler grid portion 802 is configured to guide light towards the first photodiode 212, but away from the second photodiode 210 or other photodiodes of the photodiode array 214. The second filler grid portion 804 is configured to guide light towards the second photodiode 210, and away from the first photodiode 212, the third photodiode 208, or other photodiodes of the photodiode array 214. The third filler grid portion 806 is configured to guide light towards the third photodiode 208, but away from the second photodiode 210 or other photodiodes of the photodiode array 214. In some embodiments, the first filler grid portion 802 is formed substantially above the metal grid 510 and substantially between the first dielectric grid portion 712 and the second dielectric grid portion 714. The second filler grid portion 804 is formed substantially above the metal grid 510 and substantially between the second dielectric grid portion 714 and the third dielectric grid portion 716. The third filler grid portion 806 is formed substantially above the metal grid 510 and substantially between the third dielectric grid portion 716 and the fourth dielectric grid portion 718.

Figure 8B:
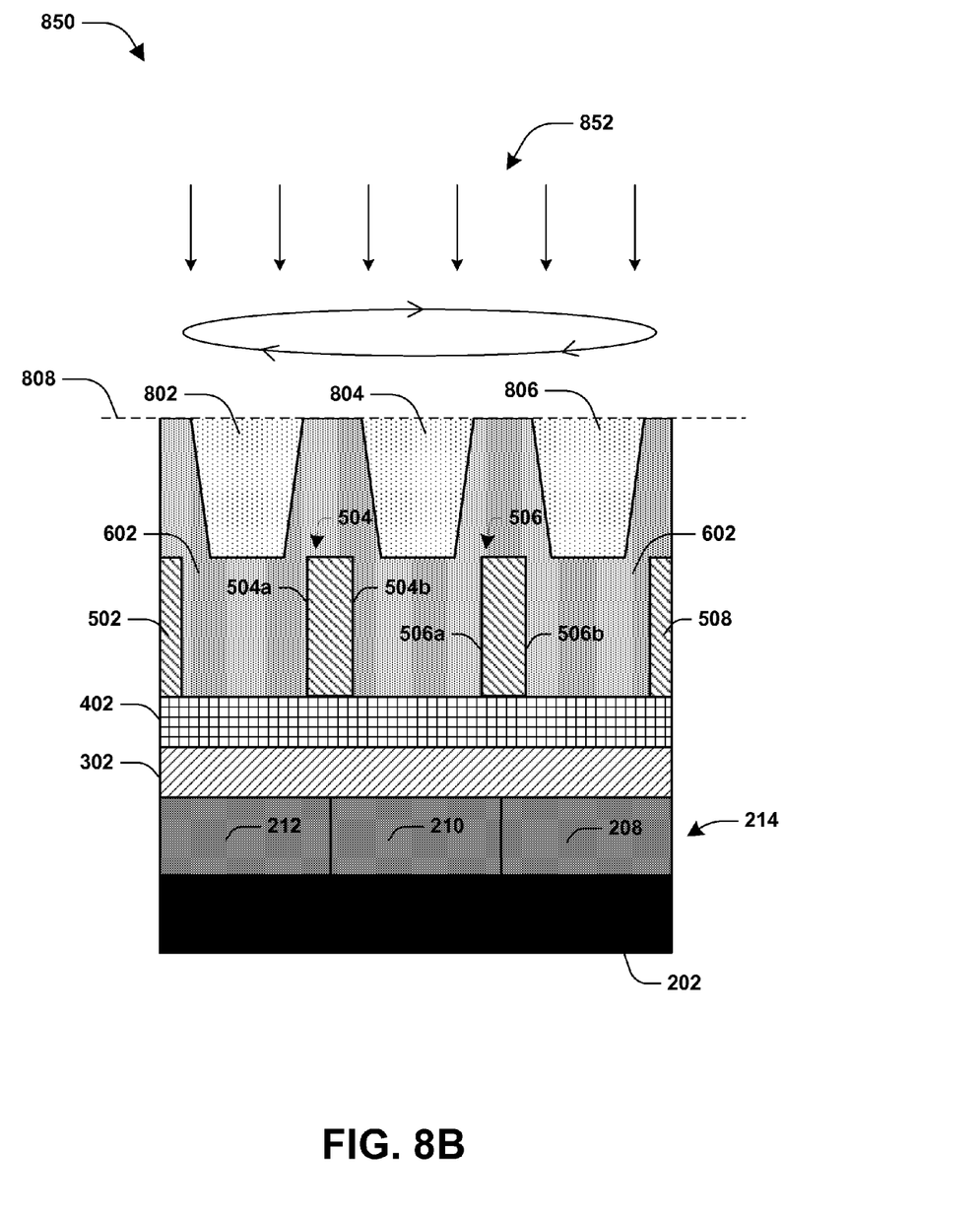
FIG. 8B is an illustration of a filler grid of an image sensor, according to some embodiments.

In some embodiments, the filler grid comprises a filler material, such as a dielectric material, an organic material, a polymer, a color filter material, or any other fill material, having a first refractive index, such as a relatively higher refractive index, that is different than a second refractive index, such as a relatively lower refractive index, of the dielectric grid 710. In some embodiments, if the filler grid does not comprise a color filter material, then a color filter material is formed over the filler grid. For example, if the first filler grid portion 802 does not comprise a color filter material, then a first color filter material is formed over, under, between, etc. the first filler grid portion 802, and this process is performed for one or more filler grid portions so that the filler grid filters light in a desired matter. It will be appreciated that due to the different refractive indices of the filler grid and the dielectric grid, when light, such as photons, encounter an interface between the filler grid and the dielectric grid 710, the light is reflected away from the dielectric grid 710 and back into the filler grid, such that the light is not directed towards an incorrect photodiode. In some embodiments, the filler material comprises a dielectric material that is different than dielectric material used to form the dielectric grid 710. In an example, the filler material comprises silicon nitride and the dielectric grid 710 comprises silicon oxide because silicon oxide and silicon nitride have different refractive indices. In some embodiments, the filler grid is formed by a deposition process of the dielectric material, such that the color filter material is formed over a top portion, illustrated by line 808, of the dielectric grid 710, as illustrated by example 800 of FIG. 8A. In some embodiments, the filler grid is formed up to but not over the top portion of the dielectric grid 710, as illustrated by example 850 of FIG. 8B. For example, a portion of the filler grid formed above the top portion is polished off by a chemical mechanical polishing (CMP) technique 852.

In some embodiments where the filler grid comprises a color filter material, at least some different filler grid portions are configured to allow different colors or wavelengths of light to pass there-through. For example, the first filler grid portion 802 is configured to allow red light, or wavelengths corresponding to red-light, to pass there-through, but substantially no other colors of light; the second filler grid portion 804 is configured to allow blue light, or wavelengths corresponding to blue-light, to pass there-through, but substantially no other colors of light; the third filler grid portion 806 is configured to allow green light, or wavelengths corresponding to green-light, to pass there-through, but substantially no other colors of light, etc. Where one or more filler grid portions do not comprise a color filter material, then a color filter material is formed over, under, between, etc. one or more of these filler grid portions to nevertheless facilitate desired filtering. In some embodiments, the first photodiode 212 thus detects red light, the second photodiode 210 detects blue light, and the third photodiode 208 detects green light. In some embodiments, other photodiodes detect other colors of light.

Figure 8C:
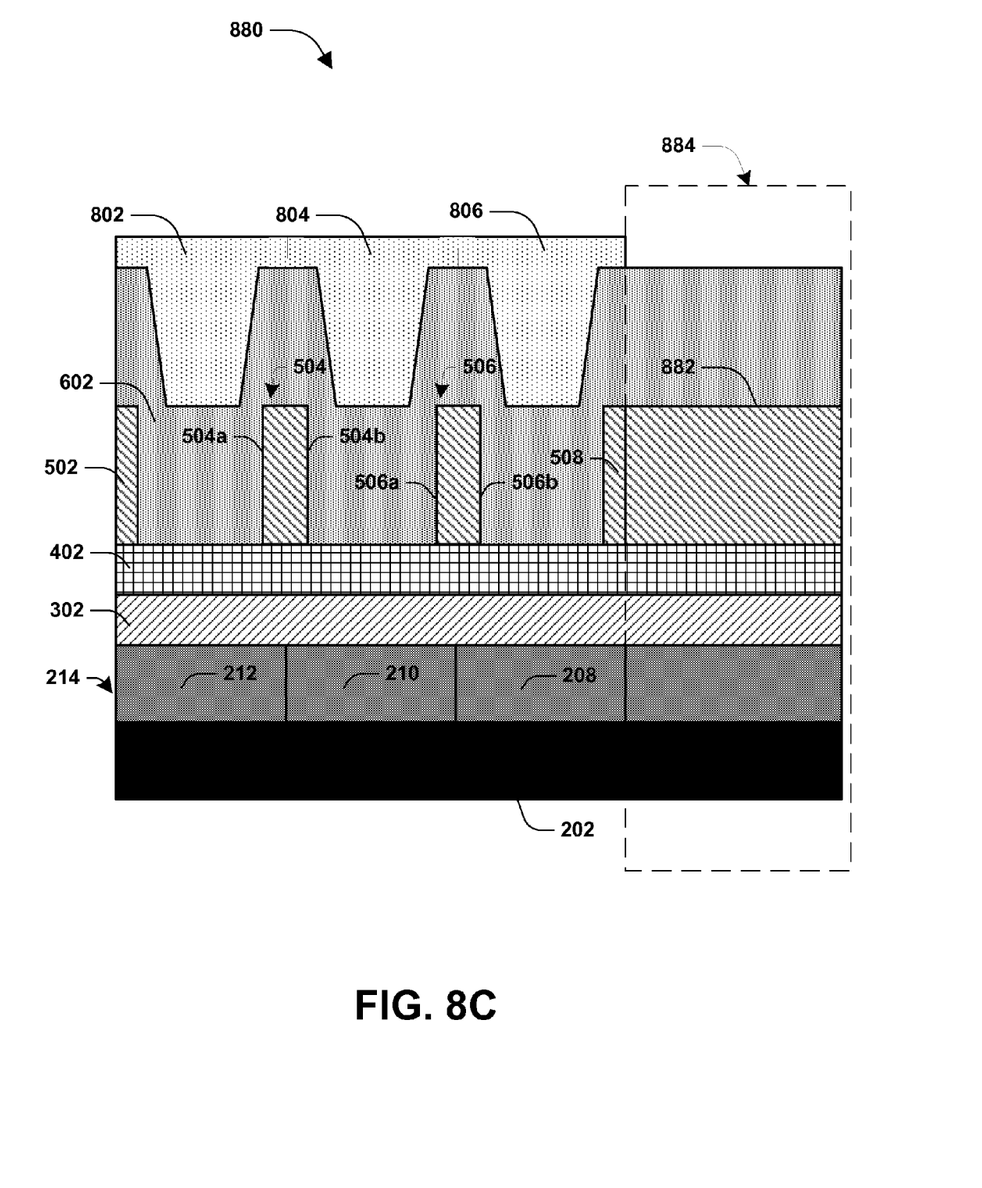
FIG. 8C is an illustration of a calibration region of an image sensor, according to some embodiments.

In some embodiments, the image sensor comprises a calibration region 884, such as a black level calibration region, as illustrated by example 880 of FIG. 8C. The calibration region 884 comprises a metal structure 882 configured to block light, such as from impinging upon underlying photodiodes. In an example, the metal grid 510 and the metal structure 882 are formed from the same metal layer, such that one or more masks used to form the metal structure 882 are used to form the metal grid 510. In this way, the metal grid 510 is formed without additional masks or processing steps.

Figure 9:
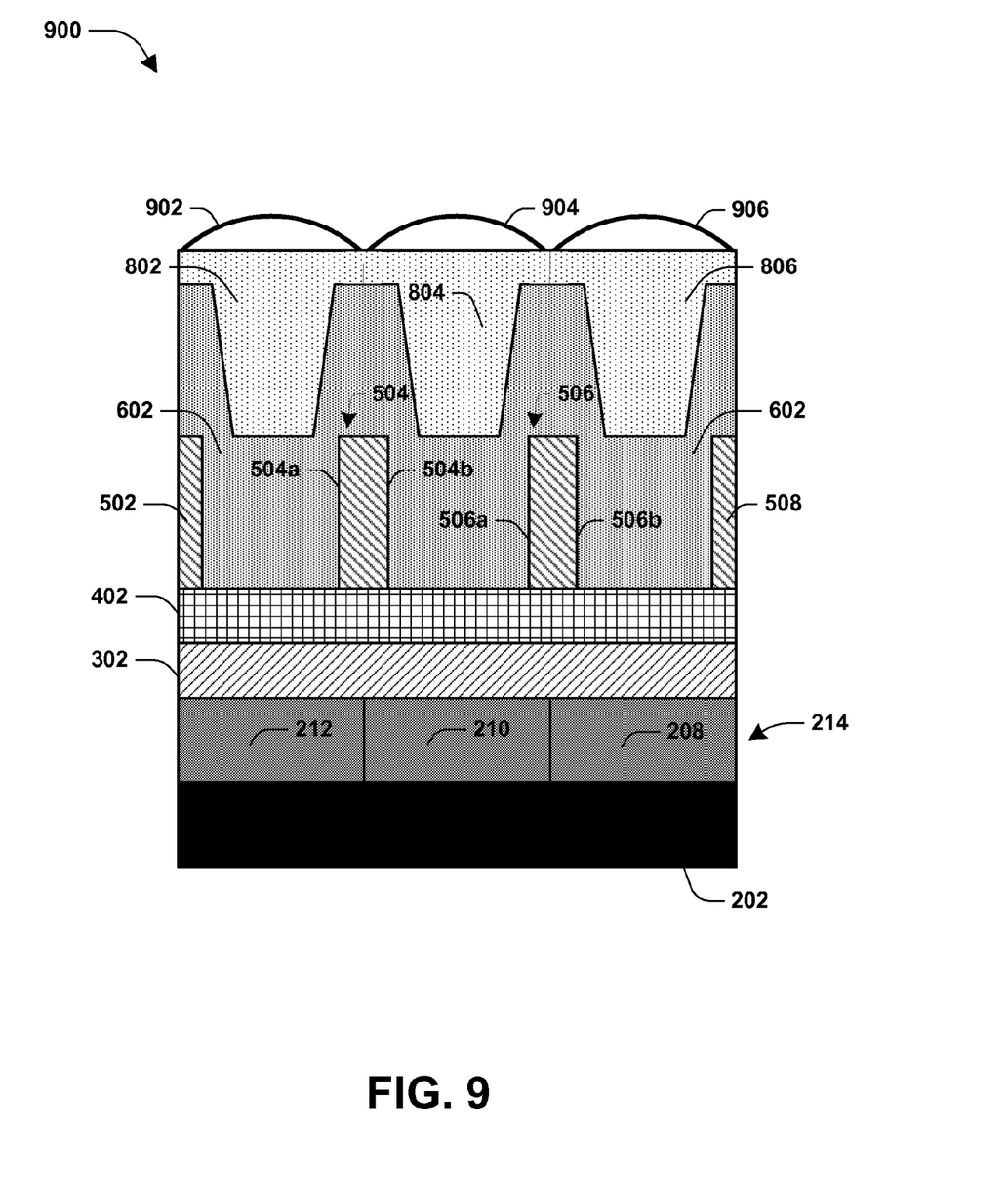
FIG. 9 is an illustration of one or more lens structures of an image sensor, according to some embodiments.

In some embodiments, the image sensor comprises one or more lens structures, such as a micro-lens, as illustrated by example 900 of FIG. 9. For example, the image sensor comprises a first lens structure 902 configured to focus light towards the first photodiode 212, a second lens structure 904 configured to focus light towards the second photodiode 210, a third lens structure 906 configured to focus light towards the third photodiode 208, or other lens structures not illustrated.

Figure 10:
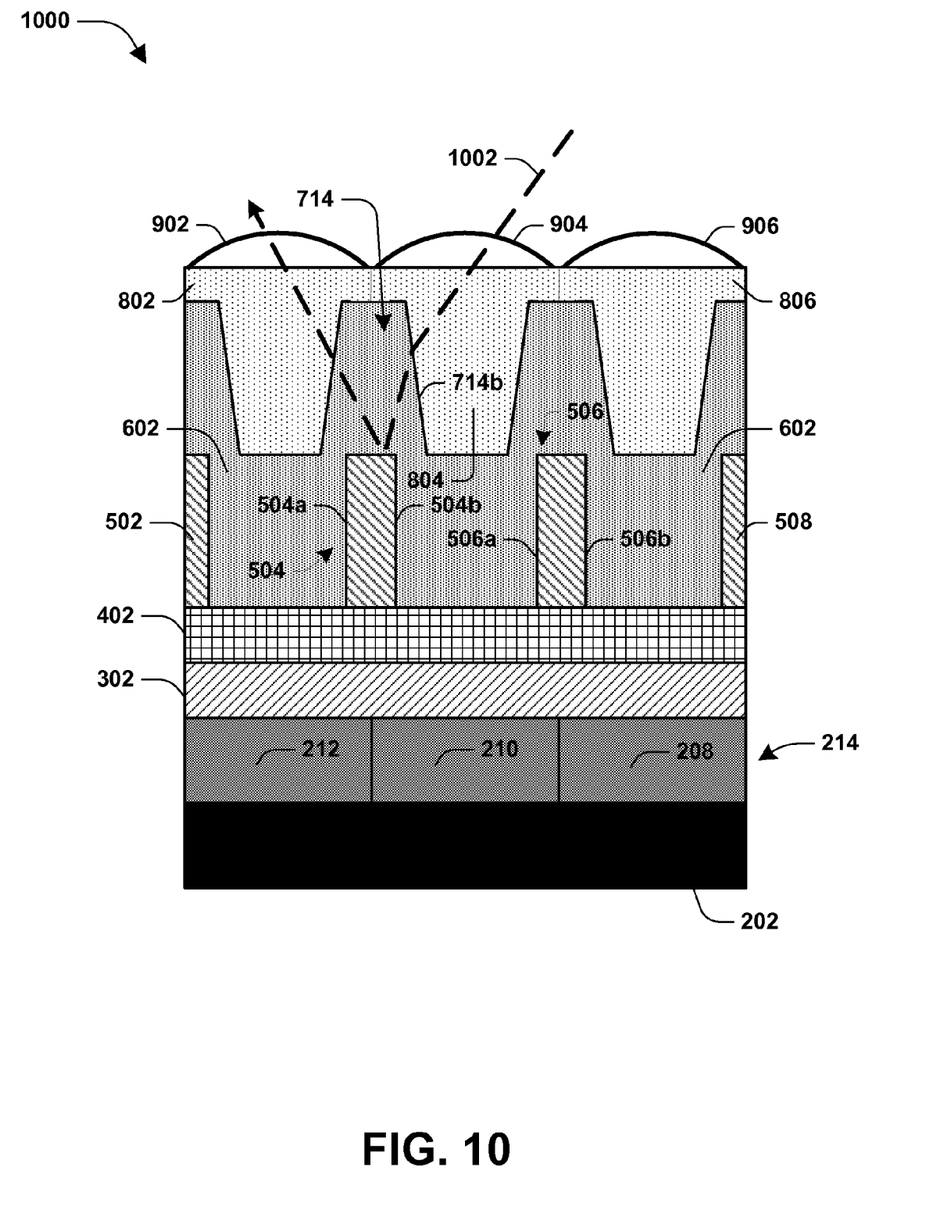
FIG. 10 is an illustration of a metal grid reflecting light away from a photodiode, according to some embodiments.

FIG. 10 illustrates an example 1000 of the second metal grid portion 504 reflecting light 1002 away from the first photodiode 212. That is, the light 1002 is focused by the second lens structure 904 towards the second photodiode 210, such that the second photodiode 210, but not the first photodiode 212, the third photodiode 208, or other photodiodes, is to detect the light 1002. After passing through the second lens structure 904, the light 1002 passes through the second filler grid portion 804. In an example, the second dielectric grid portion 714, such as an interface between the second surface 714*b* and the second filler grid portion 804, is unable to reflect the light 1002 substantially towards the second photodiode 210. Instead, the light 1002 passes through the second dielectric grid portion 714 and towards the first photodiode 212. The second metal grid portion 504 has a reflectance property that is capable of reflecting the light 1002 away from the first photodiode 212 so that the light 1002 is not incorrectly detected by the first photodiode 212 since the light 1002 is to be detected by the second photodiode 210. Accordingly, the light 1002 is reflected away from the photodiode array 214 to mitigate incorrect detection of the light 1002.

Figure 11:
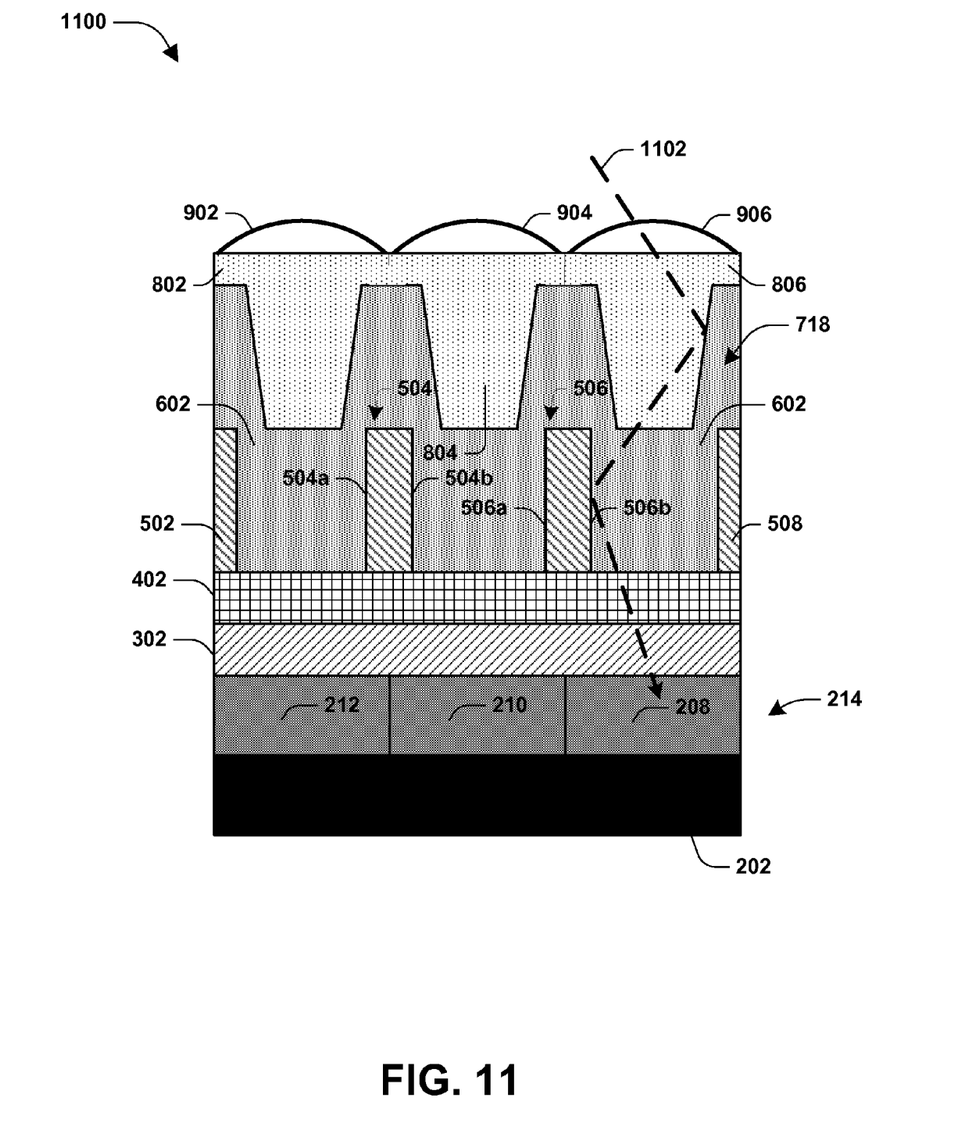
FIG. 11 is an illustration of a dielectric grid and a metal grid guiding light towards a photodiode, according to some embodiments.

FIG. 11 illustrates an example 1100 of the third filler grid portion 806, the fourth dielectric grid portion 718, and the third metal grid portion 506 guiding light 1102 towards the third photodiode 208. That is, the light 1102 is focused by the third lens structure 906 towards the third photodiode 208, such that the third photodiode 208, but not the first photodiode 212, the second photodiodes 210, or other photodiodes, is to detect the light 1102. After passing through the third lens structure 906, the light 1102 passes through the third filler grid portion 806. When the light 1102 reaches an interface between the third filler grid portion 806 and the fourth dielectric grid portion 718, the light 1102 is reflected back into the third filler grid portion 806 based upon a refractive index difference between the third filler grid portion 806 and the fourth dielectric grid portion 718. For example, the light 1102 in FIG. 11 impinges upon the interface at an angle that is different than an angle at which the light 1002 impinges upon the interface in FIG. 10, such that the refractive index difference at the interface in FIG. 11 is sufficient to reflect the light 1102 whereas the refractive index difference at the interface in FIG. 10 is not sufficient to reflect the light 1002. In this way, the light 1102 continues to travel through the third filler grid portion 806, as opposed to passing through the interface and into an adjacent portion of the dielectric layer 602.

The light 1102 passes through the third filler grid portion 806 and into the dielectric layer 602 towards the third photodiode 208. When the light 1102 reaches the fourth interface 506*b* of the third metal grid portion 506, the light 1102 is reflected away from the third metal grid portion 506 and towards the third photodiode 208, as opposed to passing through the third metal grid portion 506 towards the second photodiode 210. The light 1102 is reflected by the third metal grid portion 506 based upon a reflectance property of the third metal grid portion 506. In this way, the light 1102 passes through the barrier layer 402 and the anti-reflective layer 302, and is correctly detected by the third photodiode 208.

Figure 12:
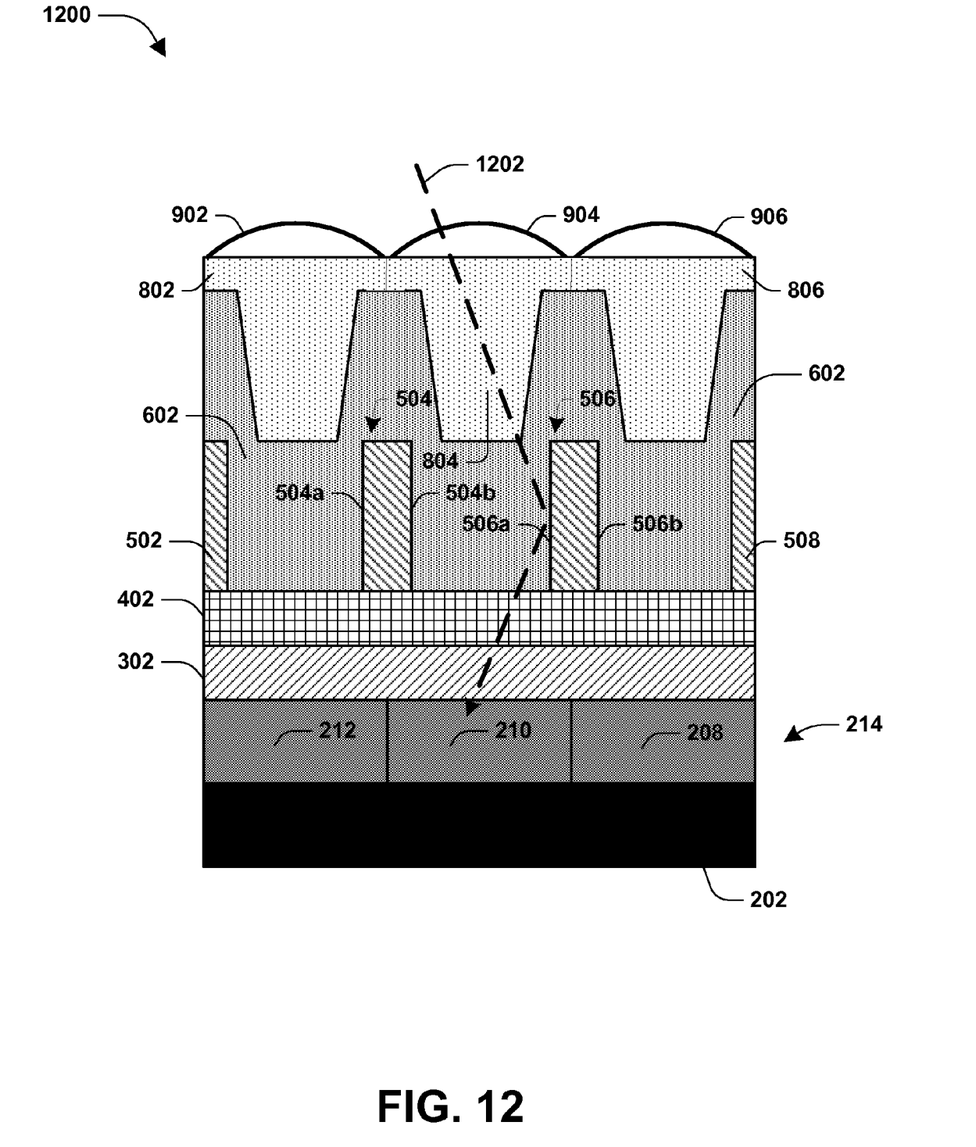
FIG. 12 is an illustration of a metal grid guiding light towards a photodiode, according to some embodiments.

FIG. 12 illustrates an example 1200 of the third metal grid portion 506 guiding light 1202 towards the second photodiode 210. That is, the light 1202 is focused by the second lens structure 904 towards the second photodiode 210, such that the second photodiode 210, but not the first photodiode 212, the third photodiode 208, or other photodiodes, is to detect the light 1202. After passing through the second lens structure 904, the light 1102 travels through the second filler grid portion 804 and into the dielectric layer 602. When the light 1202 reaches the third interface 506*a* of the third metal grid portion 506, the light 1202 is reflected away from the third metal grid portion 506 and towards the second photodiode 210, as opposed to passing through the third metal grid portion 506 towards the third photodiode 208. The light 1202 is reflected by the third metal grid portion 506 based upon a reflectance property of the third metal grid portion 506. In this way, the light 1202 passes through the barrier layer 402 and the anti-reflective layer 302, and is correctly detected by the second photodiode 210.

According to an aspect of the instant disclosure, an image sensor is disclosed. The image sensor comprises a metal grid formed over a photodiode array. The metal grid comprises one or more metal grid portions, such as a first metal grid portion comprising a first interface configured to guide light towards a first photodiode and deflect the light away from a second photodiode. For example, the first metal grid portion comprises a material having a reflectance property capable of reflecting light. The image sensor comprises a dielectric grid formed within a dielectric layer formed over the metal grid. The dielectric grid comprises one or more dielectric portions, such as a first dielectric grid portion configured to guide the light towards the first photodiode and deflect the light away from the second photodiode. In this way, crosstalk, otherwise resulting from incorrect detection of light by photodiodes, is mitigated.

According to an aspect of the instant disclosure, an image sensor is disclosed. The image sensor comprises a photodiode array formed over a substrate. The image sensor comprises a metal layer formed over a photodiode array. The metal layer comprises a metal gird configured to guide light towards a first photodiode of the photodiode array. For example, the metal grid comprises a material having a reflectance property capable of reflecting the light. The image sensor comprises a dielectric grid formed within a dielectric layer and over the metal grid. The dielectric grid is configured to guide the light towards the first photodiode of the photodiode array.

According to an aspect of the instant disclosure, a method for forming an image sensor is provided. The method comprises forming a metal grid over a photodiode array. The metal grid comprises a first metal grid portion comprising a first interface configured to guide light towards the first photodiode and deflect the light away from a second photodiode. A dielectric layer is formed over the metal grid. One or more trenches are formed into the dielectric layer to create a dielectric grid. The dielectric grid comprises a first dielectric grid portion configured to guide the light towards the first photodiode and deflect the light away from the second photodiode.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An image sensor, comprising:
   a metal grid formed over a photodiode array, the metal grid comprising:
      a first metal grid portion comprising a first interface configured to guide light towards a first photodiode and deflect the light away from a second photodiode; and
      a second metal grid portion comprising a second interface configured to guide the light towards the first photodiode;
   a dielectric extending between the first metal grid portion and the second metal grid portion, the dielectric comprising a first material;
   a dielectric grid formed over the metal grid, the dielectric grid comprising:
      a first dielectric grid portion; and
      a second dielectric grid portion; and
   a filler material extending between the first dielectric grid portion and the second dielectric grid portion, the filler material different than the first material.

2. The image sensor of claim 1, wherein the second interface is configured to deflect the light away from a third photodiode.

3. The image sensor of claim 1, wherein the first dielectric grid portion is configured to deflect the light away from the second photodiode.

4. The image sensor of claim 1, wherein the first dielectric grid portion has a first refractive index that is different than a second refractive index of the filler material.

5. The image sensor of claim 4, wherein the second refractive index is greater than the first refractive index.

6. The image sensor of claim 1, comprising:
   a buffer layer formed under and in physical contact with the metal grid.

7. The image sensor of claim 6, wherein the filler material is not in physical contact with the buffer layer.

8. The image sensor of claim 1, wherein the second dielectric grid portion is configured to guide the light towards the second photodiode and deflect the light away from the first photodiode.

9. An image sensor comprising:
   a photodiode array formed over a substrate;

an anti-reflection coating formed over the photodiode array;
a buffer layer formed over the anti-reflection coating;
a metal grid formed over the buffer layer and configured to guide light towards a first photodiode of the photodiode array;
a dielectric grid formed over the metal grid and configured to guide the light towards the first photodiode of the photodiode array; and
a filler grid formed over the metal grid, wherein the filler grid is not in physical contact with the buffer layer.

10. The image sensor of claim 9, wherein the buffer layer is in physical contact with the metal grid.

11. The image sensor of claim 9, comprising:
one or more lens structures over the filler grid.

12. The image sensor of claim 9, comprising:
a metal structure comprising an interface configured to block the light from entering a calibration region.

13. The image sensor of claim 9, wherein the dielectric grid has a first refractive index that is different than a second refractive index of the filler grid.

14. The image sensor of claim 13, wherein the second refractive index is greater than the first refractive index.

15. A method for forming an image sensor, comprising:
forming a metal grid over a photodiode array, the metal grid comprising a first metal grid portion comprising a first interface configured to guide light towards a first photodiode of the photodiode array and deflect the light away from a second photodiode of the photodiode array;
forming a dielectric layer over the metal grid; and
forming one or more trenches into a portion of the dielectric layer above the metal grid to form a dielectric grid above the metal grid, the dielectric grid comprising a first dielectric grid portion configured to guide the light towards the first photodiode and deflect the light away from the second photodiode.

16. The method of claim 15, wherein the metal grid is formed using a material having a light-reflective property.

17. The method of claim 15, comprising:
forming a filler material between the first dielectric grid portion and a second dielectric grid portion of the dielectric grid, the filler material having a second refractive index that is different than a first refractive index of the dielectric grid.

18. The method of claim 17, wherein the second refractive index is greater than the first refractive index.

19. The method of claim 15, comprising:
forming a buffer layer, wherein the forming a metal grid comprises forming the metal grid over the buffer layer.

20. The method of claim 15, wherein no trenches are formed in a second portion of the dielectric layer extending between the first metal grid portion and a second metal grid portion of the metal grid.

* * * * *